United States Patent
Xu et al.

(10) Patent No.: US 11,922,850 B1
(45) Date of Patent: Mar. 5, 2024

(54) IMAGE DISPLAY METHOD

(71) Applicant: Glenfly Tech Co., Ltd., Shanghai (CN)

(72) Inventors: Yiding Xu, Shanghai (CN); Jianhong Pan, Shanghai (CN); Jiajun Li, Shanghai (CN)

(73) Assignee: GLENFLY TECH CO., LTD., Shanghai (CN)

( * ) Notice: Subject to any disclaimer, the term of this patent is extended or adjusted under 35 U.S.C. 154(b) by 0 days.

(21) Appl. No.: 17/968,335

(22) Filed: Oct. 18, 2022

(30) Foreign Application Priority Data

Sep. 2, 2022 (CN) .......................... 202211070504.1

(51) Int. Cl.
G09G 3/20 (2006.01)
G09G 3/3208 (2016.01)
G09G 3/36 (2006.01)
H04M 1/02 (2006.01)
H10K 59/121 (2023.01)
H10K 59/65 (2023.01)

(52) U.S. Cl.
CPC ......... *G09G 3/2074* (2013.01); *G09G 3/3208* (2013.01); *G09G 3/3607* (2013.01); *G09G 2320/0233* (2013.01); *G09G 2320/0626* (2013.01); *G09G 2360/16* (2013.01); *H04M 1/0264* (2013.01); *H10K 59/121* (2023.02); *H10K 59/65* (2023.02)

(58) Field of Classification Search
CPC ............... G09G 3/2074; G09G 3/3208; G09G 2320/0233; G09G 2320/0626; G09G 2360/16; G09G 3/3607; H04M 1/0264; H10K 59/121; H10K 59/65
See application file for complete search history.

(56) References Cited

U.S. PATENT DOCUMENTS

2020/0234634 A1* 7/2020 Li .................. G09G 3/3208
2021/0358379 A1* 11/2021 Li .................. H10K 59/121

* cited by examiner

*Primary Examiner* — Douglas M Wilson

(57) ABSTRACT

An image display method includes: obtaining attribute information of each of sub-pixels in an under-display camera region and in a normal display region; calculating a compensated brightness value of the under-display camera region and an attenuated brightness value of the normal display region according to the attribute information; displaying an image according to the compensated brightness value of the under-display camera region and the attenuated brightness value of the normal display region.

12 Claims, 3 Drawing Sheets

102

Obtaining attribute information each of sub-pixels in an under-display camera region and a normal display region

104

Calculating a compensated brightness value of the under-display camera region and an attenuated brightness value of the normal display region according to the attribute information

106

Displaying an image according to the compensated brightness value and the attenuated brightness value

IMAGE DISPLAY METHOD

CROSS-REFERENCE TO RELATED APPLICATIONS

The present application claims priority to Chinese Patent Application No. 202211070504.1 filed on Sep. 2, 2022, the content of which is incorporated herein by reference in its entirety.

TECHNICAL FIELD

The present disclosure relates to the technical field of image display, and in particular, to an image display method applied to an under-display camera.

BACKGROUND

Unlike conventional liquid crystal display (LCD) display technologies, the organic light emitting diode (OLED) display technology does not require a backlight, and employs very thin coating of organic materials and a glass substrate. The organic material emits light in response to an electric current being conducted. In addition, the OLED display screen can be made lighter, thinner, have a larger viewing angle, and can significantly save power.

Nowadays, the OLED under-display camera technology has gradually become a hot topic.

SUMMARY

According to some embodiments, the image display method includes: obtaining attribute information of each of sub-pixels in an under-display camera region and in a normal display region; calculating a compensated brightness value of the under-display camera region and an attenuated brightness value of the normal display region according to the attribute information; displaying an image according to the compensated brightness value and the attenuated brightness value.

In one of the embodiments, the attribute information includes a brightness value and arrangement information of each of the sub-pixels.

In one of the embodiments, the calculating the compensated brightness value of the under-display camera region includes: obtaining gray values of sub-pixels within a pixel unit range of the displayed image in the under-display camera region, multiplying an average value of the gray values by an area coefficient, and taking the multiplying result as the compensated brightness value.

In one of the embodiments, the average value is calculated by a following formula:

$$G_{out} = \left((G_0^{2.2} + G_1^{2.2} + G_2^{2.2} + G_3^{2.2}) * \frac{1}{4} * W_R\right)^{\frac{1}{2.2}}$$

wherein $G_0$, $G_1$, $G_2$, and $G_3$ denote the brightness values of the sub-pixels within the pixel unit range respectively; $W_R$ denotes the area coefficient of the sub-pixels; $G_{out}$ denotes the average value of output brightness values of the sub-pixels.

In one of the embodiments, the area coefficient $W_R$ is a number greater than 1.

In one of the embodiments, the calculating the attenuated brightness value of the normal display region includes: calculating a retaining ratio according to the number of sub-pixels retained in the under-display camera region, taking the retaining ratio as an attenuation degree of the normal display region, and calculating the attenuated brightness value of the normal display region.

In one of the embodiments, the attenuated brightness value is calculated by a following formula:

$$G_{out} = G_{in} * \left(\frac{1}{m}\right)^{\frac{1}{2.2}}$$

wherein $G_{in}$ denotes a current brightness value of the sub-pixel of the displayed image in the normal display region; $G_{out}$ denotes the attenuated brightness value of the sub-pixel in the normal display region; $1/m$ is the retaining ratio.

In one of the embodiments, the image display method further includes: generating a brightness transition region between the under-display camera region and the normal display region.

In one of the embodiments, the generating the brightness transition region includes: generating the brightness transition region with a preset width; obtaining a distance between each of the sub-pixels in the brightness transition region and the under-display camera region; calculating a brightness value of each of the sub-pixels in the brightness transition region according to a current brightness value of the corresponding sub-pixel in the brightness transition region, a brightness value of the corresponding sub-pixel in the under-display camera region, and the distance.

In one of the embodiments, the brightness value of the sub-pixel in the brightness transition region is calculated by a following formula:

$$data_{out} = data_{in} + (v - data_{in}) * d/D$$

wherein $data_{out}$ denotes the brightness value output by the sub-pixel in the brightness transition region; $data_{in}$ denotes a current brightness value of the sub-pixel; d denotes the distance between the sub-pixel in the current brightness transition region and the under-display camera region; D denotes the preset width of the brightness transition region; v denotes a brightness value of the corresponding sub-pixel in a pixel unit range in the under-display camera region.

In one of the embodiments, the preset width increases with an increased size of a display panel.

In one of the embodiments, the preset width increases with an increased size of a camera.

According to the above image display method applied to the under-display camera, the attribute information of each of the sub-pixels in the under-display camera region and in the normal display region is obtained, the compensated brightness value of the under-display camera region and the attenuated brightness value of the normal display region are calculated according to the attribute information. In this way, by compensating the brightness value of the under-display camera region and attenuating the brightness value of the normal display region, the overall brightness of the two regions can be kept consistent. Further, in view of the arranging order of multiple sub-pixels, the brightness of the sub-pixels can be compensated or attenuated according to the arranging order, to obtain a display buffer region between the under-display camera region and the normal display region, thereby achieving better display effect.

DETAILED DESCRIPTION

Figure 1:
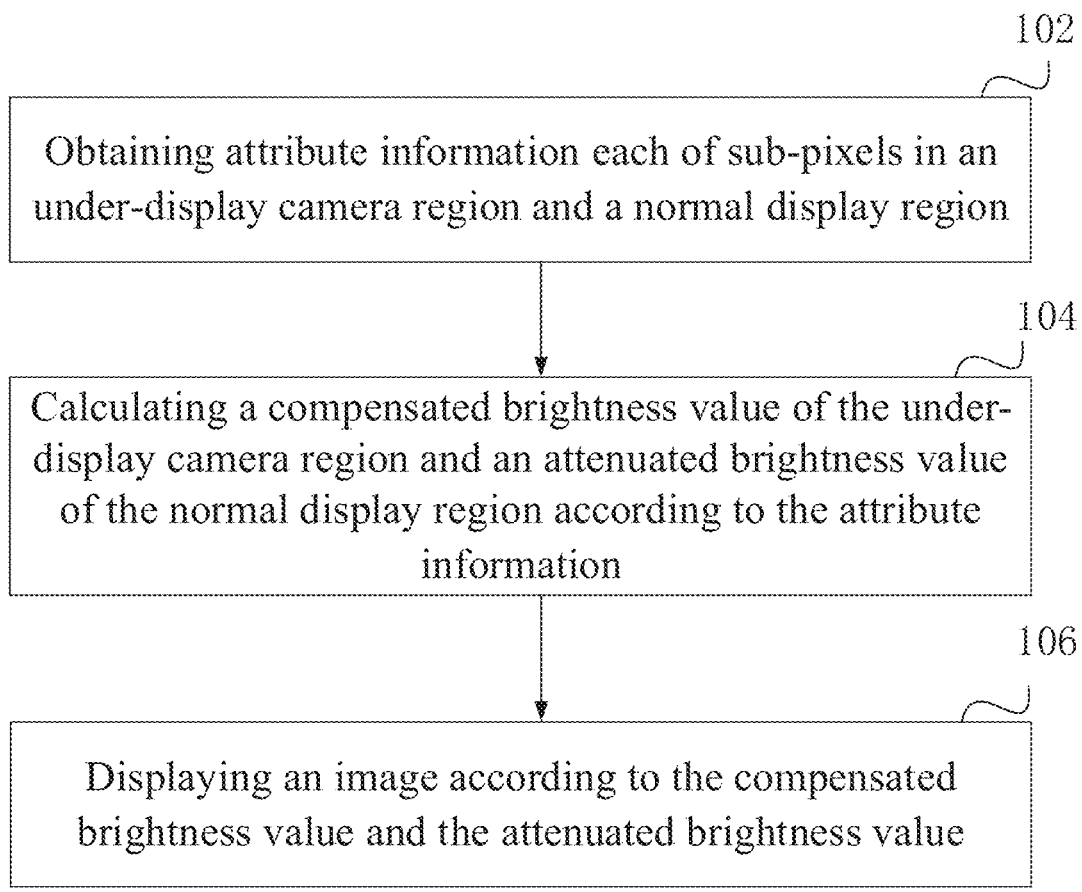
FIG. 1 is a schematic flowchart of an image display method according to an embodiment.

In order to facilitate understanding of the present disclosure, the present disclosure will be described more fully below with reference to the related drawings. Embodiments of the present disclosure are shown in the drawings. However, the present disclosure may be implemented in many different forms and is not limited to the embodiments described herein.

Inventors note that, the OLED display panel generally has many film layers, in order to ensure the amount of light entering the under-display camera, it is necessary to reduce the area of sub-pixels in the under-display camera region, or directly crop the sub-pixels, or reduce circuit wirings. This results in inconsistent overall display between the under-display camera region and other display regions (i.e., non-under-display camera regions) when the OLED displays images. Therefore, how to solve the display difference between the two regions and ensure the display quality of the entire display screen is a technical problem that those skilled in the art need to solve urgently. In view of this, the present disclosure provides an image display method applied to an under-display camera, which can ensure consistent display effect of the entire display screen.

Embodiments of the present disclosure provide an image display method that can be applied to a terminal with a camera and a display screen. Specifically, the camera is disposed under the display screen (or, the camera is hidden under the display screen). Exemplarily, the terminal in the embodiments of the present disclosure may be various devices equipped with a camera. For example, the terminal may be a wearable electronic device (such as a smart watch, etc.), a tablet computer, a desktop computer, a notebook computer, a virtual reality device, an augmented reality device, or a smart phone, etc., and the terminal is not specifically limited in the embodiments of the present disclosure.

FIG. 1 is a flowchart of an image display method according to an embodiment of the present disclosure. As shown in FIG. 1, in step 102, attribute information of each of sub-pixels in an under-display camera region and in a normal display region is obtained.

The under-display camera region refers to a camera region in which the camera is disposed under the display screen and performs capturing through the display screen. The normal display region refers to a region of the display screen outside the under-display camera region and configured to display an image. The under-display camera region and the normal display region are two adjacent regions that need to be adjusted for brightness.

The sub-pixels in the under-display camera region and in the normal display region refer to multiple sub-pixels included in the under-display camera region and the normal display region. The attribute information of each of the sub-pixels refers to inherent properties of each of the sub-pixels, such as a brightness value (or referred to as a grayscale value, a pixel value, etc.) and arrangement information (or referred to as position information, coordinate information, etc.).

It should be noted that, for the convenience of description in the description, the under-display camera region and the normal display region involved in the specification of this disclosure both indicate regions that need to be adjusted for brightness. In the following description of the specification, the above-mentioned regions will not be specifically described again.

It should be noted that, in the specification and claims of the present disclosure, adjustment for brightness is often used. However, those skilled in the art should understand that the brightness and grayscale of the image can be converted to each other through a calculation formula, or the RGB and luma and chroma (YUV) or other formats of the image can also be converted to each other by corresponding manners. That is, the specification of the present disclosure only illustrates the adjustment for brightness as an example, and those skilled in the art are likely to apply other methods to the present disclosure after learning the technical solutions of the present disclosure.

It should also be noted that the image display method is applied to a display screen including an under-display camera, that is, the display screen is used when the entire OLED panel displays an image in full screen. The display screen to which the image display method is applied is different from the mainstream display screens such as a hole punch display screen and a notch display screen in the existing art. The display screen, e.g., the hole punch display screen or the notch display screen, does not display images in the "hole punch" region or the "notch" region where camera is mounted. Whereas, the present image display method enables the image to be displayed in the region where the camera is hidden. That is, the image display method is intended to avoid the display difference effect of the image that is visible to a naked eye during displaying the image on the display screen due to the mounting of the hidden camera. In other words, when an image is displayed according to the image display method, the image can be displayed in both the camera region and the non-camera region, and there is no obvious visual difference when the image is displayed in the camera region and the non-camera region.

Specifically, a display driver chip is used to obtain attribute information of each of the sub-pixels in the under-display camera region and in the normal display region. For example, a brightness value and arrangement information of each of the sub-pixels included in the under-display camera region and in the normal display region are obtained.

Next, in step 104, a compensated brightness value of the under-display camera region and an attenuated brightness value of the normal display region are calculated according to the attribute information.

Specifically, after the display driver chip obtains the attribute information of each of the sub-pixels in the under-display camera region and in the normal display region, such as the arrangement information and the brightness value of each of the sub-pixels, the brightness value of each of the sub-pixels is adjusted, so that the brightness of each of the sub-pixels changes according to an arranging order of the multiple sub-pixels. For example, the brightness of the multiple sub-pixels can be attenuated or compensated according to the arranging order.

In an example, the attribute information includes a brightness value and arrangement information of the sub-pixel. The display driver chip can obtain the brightness value and the arrangement information of each of the sub-pixels included in the under-display camera region. In an example that the under-display camera region includes four sub-pixels, the positional relationship among the four sub-pixels can be obtained. As such, the brightness of each of the sub-pixels can be adjusted according to the arrangement information (or mutual positional relationships) of the multiple sub-pixels, so that the brightness of each of the sub-pixels changes according to the arranging order. For example, the brightness of each of the sub-pixels can be compensated according to the arranging order.

In an example, the display driver chip may be used to further obtain the brightness value and the arrangement information of each of the sub-pixels in the under-display camera region and in the normal display region. In an example that the under-display camera region includes four sub-pixels and the normal display region includes one sub-pixel, the five sub-pixels included in the under-display camera region and in the normal display region are sorted in order, so that the brightness of each of the sub-pixels can be adjusted according to the order of the five sub-pixels. That is, the attenuation of brightness is performed for the normal display region, the compensation of brightness is performed for the under-display camera region.

In an example, the display driver chip may be used to further obtain the brightness value of the normal display region, and the brightness value attenuates from the normal display region to the under-display camera region. In an example that the under-display camera region includes four sub-pixels and the normal display region includes one sub-pixel, after determining the arrangement information of the five sub-pixels, the brightness value of the sub-pixel in the normal display region is served as a reference value, the brightness value of each of the four sub-pixels included in the under-display camera region is sequentially compensated accordingly, so as to form a continuous change of the brightness values of the five sub-pixels.

Exemplarily, the normal display region may include multiple sub-pixels. As such, the above-mentioned brightness value of each of the multiple sub-pixels in the normal display region is taken as a reference value, and accordingly, the brightness value of each of the sub-pixels included in the under-display camera region is sequentially adjusted to form a continuous change of the brightness values of the multiple sub-pixels.

Next, in step 106, an image is displayed according to the compensated brightness value and attenuated brightness value.

In an example, the display driver chip may be used to further generate a transition region between the under-display camera region and the normal display region to buffer display changes of sub-pixels, so as to achieve the purpose of hiding the under-display camera region.

The transition region will be described in detail in a following section introducing the transition region in this disclosure, references may be made to that section of the transition region, which will not be described in detail herein.

According to this embodiment, in the image display method applied to the under-display camera, the attribute information of each of the sub-pixels in the under-display camera region and in the normal display region is obtained, and the compensated brightness value of the under-display camera region and the attenuated brightness value of the normal display region are calculated according to the attribute information. By compensating the brightness value of the under-display camera region and attenuating the brightness value of the normal display region, the overall brightness of the two regions can be kept consistent. Further, in view of the arranging order of the sub-pixels, the brightness of the sub-pixels can be compensated or attenuated according to the arranging order, to obtain a display buffer region between the under-display camera region and the normal display region, thereby achieving better display effect.

How to calculate the compensated brightness value of the under-display camera region and the attenuated brightness value of the normal display region according to the attribute information of each of the sub-pixels will be described in detail below.

Next, the calculating the compensated brightness value of the under-display camera region includes: obtaining gray values of each of sub-pixels within a pixel unit range of the displayed image in the under-display camera region, multiplying an average value of the gray values by an area coefficient, and taking the multiplying result as the compensated brightness value of the under-display camera region.

In an example, the display driver chip is used to obtain the gray values of the sub-pixels within a 2×2 pixel unit range of the displayed image, perform calculation according to a formula (1), and take the calculation result as an output brightness value of the corresponding sub-pixels within the 2×2 range, and further take the calculation result as the compensated brightness value of the under-display camera region. The formula (1) is as follows:

$$G_{out} = \left( (G_0^{2.2} + G_1^{2.2} + G_2^{2.2} + G_3^{2.2}) * \frac{1}{4} * W_R \right)^{\frac{1}{2.2}} \quad (1)$$

Where, $G_0$, $G_1$, $G_2$, and $G_3$ denote the brightness value s of the sub-pixels in the 2×2 pixel range respectively; $W_R$ denotes the area coefficient of the sub-pixels; $G_{out}$ denotes an average output brightness value of the sub-pixels.

It can be understood that the luminous intensity of each sub-pixel in the OLED screen is determined by a voltage difference between the two ends of the light-emitting diode, and the higher a voltage of a driving voltage, the stronger the luminous intensity. The gray value and the brightness value are exponential to the power of 2.2, and the brightness value is a linear relationship with the driving voltage.

For example, the sub-pixels in the 2×2 pixel range of the displayed image refer to the sub-pixels in the under-display camera region. It is assumed that the sub-pixels $G_1$, $G_2$, and $G_3$ in the 2×2 pixel range are reduced (or "removed"), in this case, according to formula (1), the average value of the four sub-pixels in the 2×2 pixel range is calculated and further multiplied by the area coefficient $W_R$ to obtain the brightness value of the 2×2 pixel range.

When the area of the sub-pixels is reduced, a larger voltage is required to emit the light with same light intensity, and thus, the output brightness value can be adjusted according to the area coefficient $W_R$. In order to achieve the effect of brightness compensation when the area of the sub-pixel is reduced, the value of the area coefficient $W_R$ may be increased, and the area coefficient $W_R$ is a number greater than 1.

In addition, the output value of the sub-pixel can be obtained by calculation. In the actual working process, the above calculation formula (1) can be simplified in order to reduce the calculation. Further, the 2.2 power and 1/2.2 power in the above formula (1) can be simplified to square and square root, respectively. The constant ¼ in the formula is changed to K. The K can be obtained by the calculation formula as follows:

$$\left((G_0^{2.2} + G_1^{2.2} + G_2^{2.2} + G_3^{2.2}) * \frac{1}{4}\right)^{\frac{1}{2.2}} = \left((G_0^2 + G_1^2 + G_2^2 + G_3^2) * k\right)^{\frac{1}{2}} \quad (2)$$

$$k = \frac{\left((G_0^{2.2} + G_1^{2.2} + G_2^{2.2} + G_3^{2.2}) * \frac{1}{4}\right)^{\frac{1}{1.1}}}{(G_0^2 + G_1^2 + G_2^2 + G_3^2)} \quad (3)$$

Starting from $G_0:G_1:G_2:G_3=1:1:1:1$ and ending at $G_0:G_1:G_2:G_3=1:0:0:0$, all ratios are traversed in a step length of 0.125. Based on the total ratios, it is divided into 5 intervals of 4~3, 3~2.5, 2.5~2, 2~1.5, 1.5~1 for the convenience of calculation. The mean value of each of the intervals serves as a k value of the interval, and in this way, the five k values are stored in a lookup table. By calculating and inputting the proportional relationship of the pixels, the k value needed for the current calculation can be found.

Further, the calculating the attenuated brightness value of the normal display region includes: calculating a retaining ratio according to the number of sub-pixels retained in the under-display camera region, taking the retaining ratio as an attenuation degree of the normal display region, and calculating the attenuated brightness value.

Figure 2:
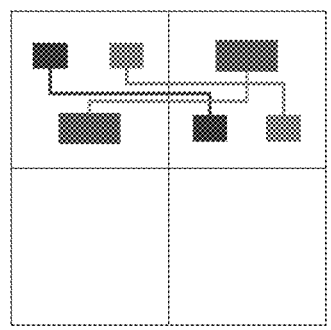
FIG. 2 is a schematic view showing a sub-pixel arrangement manner with a half of pixels cropped in an image display method according to an embodiment.
Figure 3:
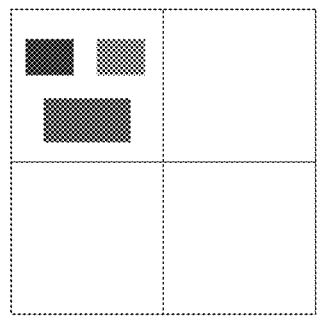
FIG. 3 is a schematic view showing a sub-pixel arrangement manner with three-quarters of pixels cropped in an image display method according to an embodiment.

FIG. 2 is a schematic view showing a sub-pixel arrangement with a half of pixels cropped in an image display method according to an embodiment of the present disclosure. FIG. 3 is a schematic view showing a sub-pixel arrangement with three-quarters of pixels cropped in an image display method according to an embodiment of the present disclosure. As shown in FIGS. 2 and 3, in an embodiment, the obtaining the attenuation degree of the normal display region according to the number of sub-pixels retained in the under-display camera region includes a following step.

The retaining ratio is calculated according to the number of sub-pixels retained in the under-display camera region, and the retaining ratio is used as the attenuation degree of the normal display region.

As shown in FIG. 2, specifically, the retained number, arrangement information and area of sub-pixels in the under-display camera region are raw information of the actual situation of the display. The information, such as the brightness value, needed for the algorithm is calculated or judged based on the raw information. The number of sub-pixels in a preset area of the normal display region is compared with the number of sub-pixels retained in the under-display camera region with the same area, and the ratio of the number of sub-pixels retained in the under-display camera region to the number of the sub-pixels in the normal display region is determined, so that the retaining ratio is taken as the attenuation degree of the normal display region. The attenuated brightness value can be calculated by a formula (4).

$$G_{out} = G_{in} * \left(\frac{1}{m}\right)^{\frac{1}{2.2}} \quad (4)$$

where, $G_{in}$ denotes a current brightness value of the sub-pixel of the displayed image in the normal display region; $G_{out}$ denotes a brightness attenuation value of the sub-pixel in the normal display region; 1/m is the retaining ratio.

For example, the 2×2 pixel range of the under-display camera region includes a half of the number of sub-pixels as compared to the 2×2 pixel range of the normal display region (as shown in FIG. 2, there are only two sub-pixels in the 2×2 pixel range, and the other region outside the sub-pixels is blank), the brightness of the sub-pixels in the normal display region needs to be attenuated by half, so 1/m=½, and the corresponding calculation formula is:

$$G_{out} = G_{in} * \left(\frac{1}{2}\right)^{\frac{1}{2.2}} \quad (5)$$

where, $G_{in}$ denotes the current brightness value of the sub-pixel of the displayed image in the normal display region; $G_{out}$ denotes that the brightness of the sub-pixel in the normal display region needs to be attenuated by half.

As shown in FIG. 3, in the cast that the 2×2 pixel range of the under-display camera region retains a quarter of the sub-pixels as compared to the 2×2 pixel range of the normal display region (as shown in FIG. 3, there is only one sub-pixel in the 2×2 pixel range, and the other region outside the sub-pixel is blank), the brightness of the sub-pixels in the normal display region needs to be attenuated by a quarter, so 1/m=¼, and the corresponding calculation formula is:

$$G_{out} = G_{in} * \left(\frac{1}{4}\right)^{\frac{1}{2.2}} \quad (6)$$

By reducing the preset area in scale, the number of sub-pixels in the preset area of the normal display region can be compared with the number of sub-pixels retained in the under-display camera region, and the ratio of the number of sub-pixels retained in the under-display camera region to the number of the sub-pixels in the normal display region can be determined.

In this embodiment, the retaining ratio is calculated according to the number of the retained sub-pixels, and the retaining ratio is used as the attenuation degree of the normal display region.

It should be noted that the above-mentioned calculating the retaining ratio according to the number of sub-pixels retained in the under-display camera region and taking the retaining ratio as the attenuation degree of the normal display region is only a specific embodiment of the present disclosure. In a modified technical solution, the attenuation degree of the normal display region can also be calculated according to parameters of reduction of the area of the sub-pixels in the under-display camera region, or the attenuation degree of the normal display region can also be calculated according to the parameters of reduction of the circuit wiring of the sub-pixels in the under-display camera region.

Herein, it should be noted that, in an embodiment of the present disclosure, the transition region is obtained by adjusting the brightness values of sub-pixels in the normal display region, and the transition region in the normal display region will be exemplified in the embodiment. However, the transition region may also be formed by adjusting both the brightness value of the normal display region and the brightness value of the under-display camera region together, or by adjusting the brightness value of the under-display camera region alone. That is, the region included in the transition region is not limited in the present disclosure.

Figure 4:
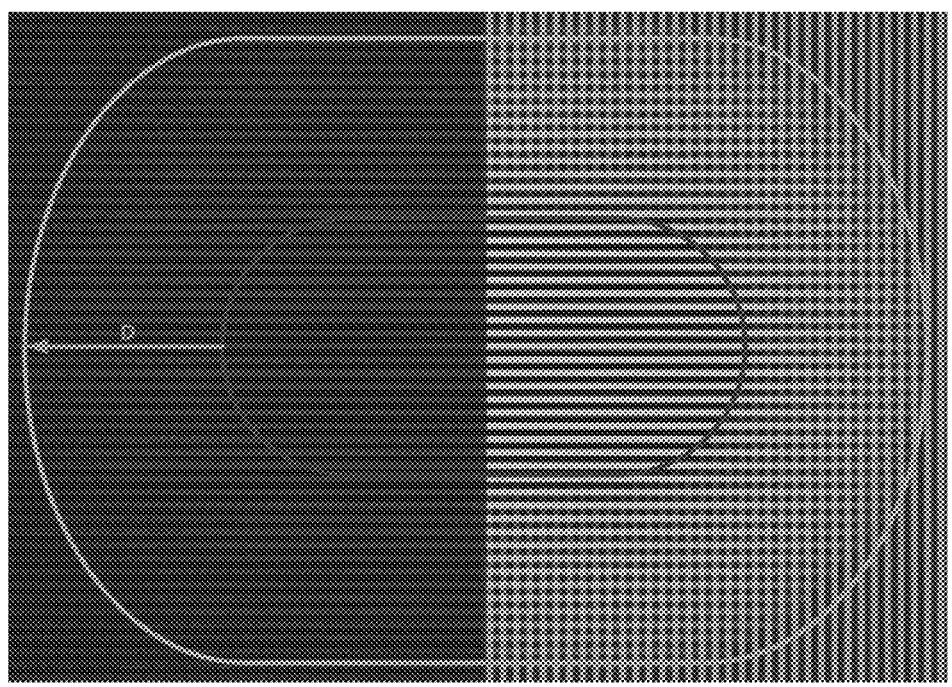
FIG. 4 is a schematic view showing a transition region in an image display method according to an embodiment.

FIG. 4 is a schematic view showing the transition region in the image display method according to an embodiment of the present disclosure. As shown in FIG. 4, the camera is hidden in an inner elliptical region (a smaller inner ellipse as shown in FIG. 4) of a display screen. The inner elliptical region is the under-display camera region, and a region between the inner elliptical region and an outer elliptical region is the normal display region.

As shown in FIG. 4, the transition region (indicated by D in FIG. 4) is the region between the inner elliptical region and the outer elliptical region, that is, the transition region is in the normal display region. Nevertheless, the transition region can also be a region disposed in the under-display camera region; or the transition region can also be a region disposed in a manner that a half of the region is disposed in the normal display region and a half of the region is disposed in the under-display camera region.

As shown in FIG. 4, the transition region is elliptical, but the transition region may be in other regular or irregular shapes such as a circular ring, a square, and a rectangle, etc.

In this embodiment, by generating a brightness transition region between the under-display camera region and the normal display region, display changing effect in different regions can be hidden, local over-brightness effect can be avoided, and user experience can be improved.

Figure 5:
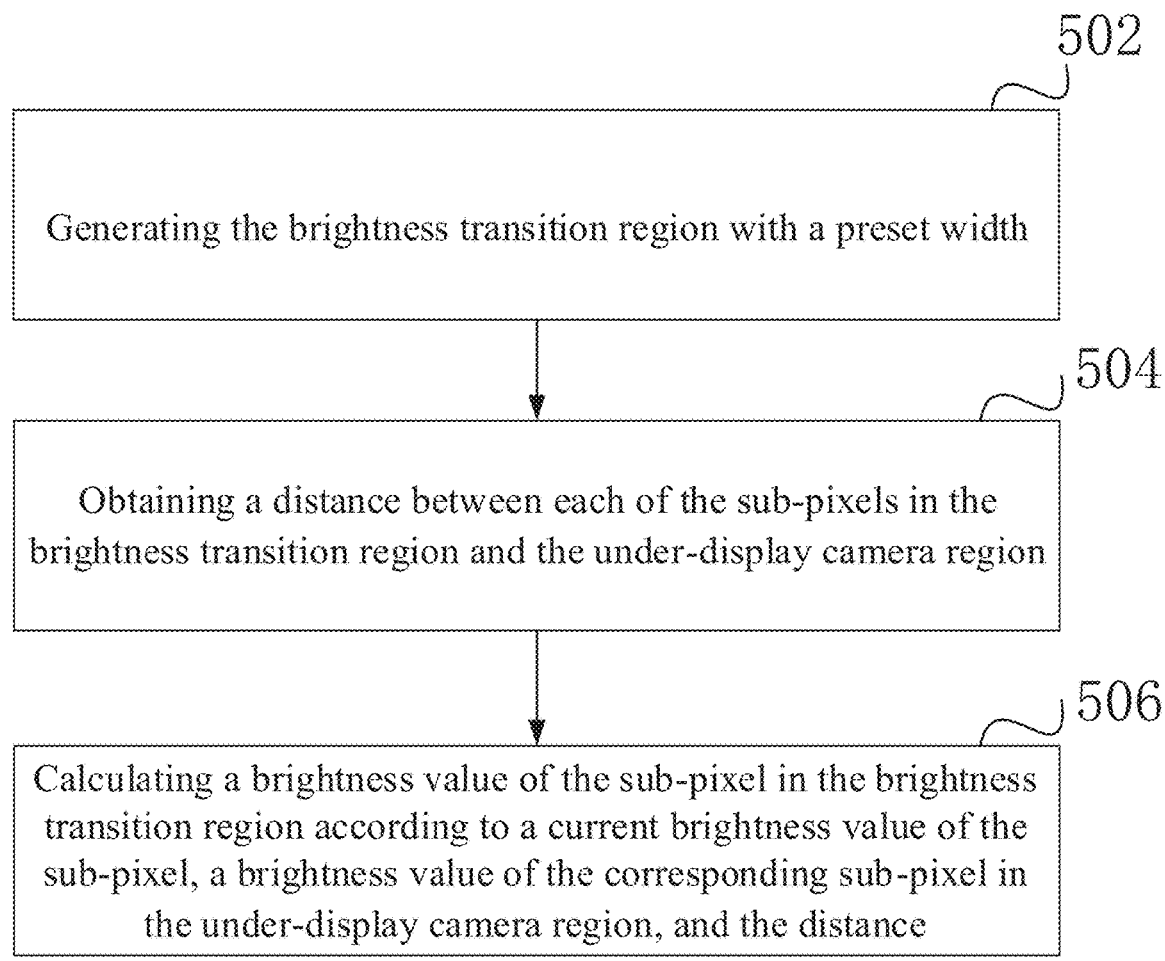
FIG. 5 is a schematic flowchart of generating a transition region in an image display method according to an embodiment.

FIG. 5 is a schematic flowchart of generating the transition region in the image display method according to an embodiment of the present disclosure. In step 502, a brightness transition region with a preset width is generated.

Specifically, a preset width is configured between the under-display camera region and the normal display region to generate the brightness transition region. In the brightness transition region, the brightness of the under-display camera region is compensated, and the brightness of the normal display region is attenuated, so that the buffering change effect of the sub-pixels can be formed at the junction between the under-display camera region and the normal display region.

The preset width of the transition region can be specifically configured according to a size of the display panel, a size of the camera, or a usage of the panel. In an example, the preset width increases with the increased size of the display panel, or the preset width increases with the larger size of the camera. In another example, in the case that the display panel is applied to a smart phone, a computer, or a video wall etc., the preset width can be adjusted according to a size of the screen of the smart phone, the computer, or the video wall etc.

In step 504, a distance between each of the sub-pixels in the brightness transition region and the under-display camera region is obtained.

The sub-pixels in the brightness transition region refers to sub-pixels in the transition region at the junction between the under-display camera region and the normal display region.

Specifically, by obtaining the distance between each of the sub-pixels in the brightness transition region and the under-display camera region, the brightness of each of the sub-pixels in the brightness transition region can be adjusted, and the distance can indicate the color gradient from the sub-pixels in the normal display region to the sub-pixels in the under-display camera region. For example, as the sub-pixels in the brightness transition region is getting closer to the under-display camera region, the brightness of the sub-pixels gradually decreases.

In Step 506, a brightness value of each of the sub-pixels in the brightness transition region is calculated according to a current brightness value of each of the sub-sub-pixels in the brightness transition region, a brightness value of a corresponding sub-pixel in the under-display camera region, and the distance.

Specifically, the sub-pixels in the brightness transition region form a corresponding relation with the sub-pixels in the under-display camera region, and the buffering change effect of the sub-pixels is shown in the transition region. The brightness value of each of the sub-pixels in the brightness transition region can be calculated by a following calculation formula:

$$data_{out} = data_{in} + (v - data_{in}) * d/D$$

where, $data_{out}$ denotes the brightness value output by the sub-pixel in the transition region; $data_{in}$ denotes the current brightness value of the sub-pixel in the transition zone region; d denotes the distance between the sub-pixel in the current brightness transition region and the under-display camera region; D denotes the preset width of the transition region; v denotes a brightness value of the corresponding sub-pixel(s) in the 2×2 pixel range in the under-display camera region.

Specifically, the brightness values of the sub-pixels in the brightness transition region can be obtained through the above calculation formula of each of the sub-pixels in the brightness transition region, so that the transition region can be generated between the sub-pixels in the under-display camera region and the sub-pixels in the normal display region, which facilitates the hidden of the visual difference between different regions.

In this embodiment, the brightness change in the brightness transition region with the preset width is determined by obtaining the distance between each of the sub-pixels in the brightness transition region and the under-display camera region. The brightness value of each of the sub-pixels in the junction region between the under-display camera region and the normal display region, can be determined according to the current brightness value of the sub-pixel in the brightness transition region, the brightness values of the corresponding sub-pixels in the under-display camera region, and the distance. According to the changes in the brightness values of the sub-pixels in the junction region, the transition region is generated between the under-display camera region and the normal display region, and thus the visual difference between the under-display camera region and the normal display region can be hided, which reduces the influence of the display difference between the under-display camera region and the normal display region on the user.

Figure 6:
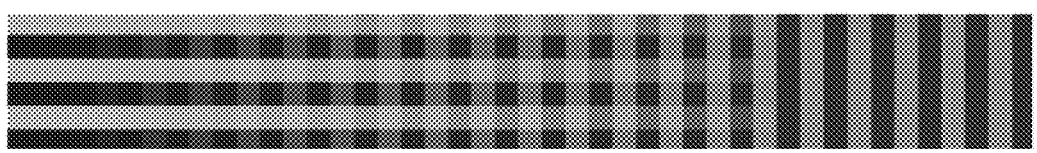
FIG. 6 is an enlarged schematic view of a transition region in an image display method according to an embodiment.

FIG. 6 is an enlarged schematic view of the transition region in the image display method according to an embodiment of the present disclosure. FIG. 6 shows the transition between the two regions, which is beneficial to hide the distinct display changes between the two regions, and reduce the influence of the display difference between two regions on the user.

It should be understood that, although the steps in the flowcharts involved in the above embodiments are sequentially shown in an order indicated by the arrows, these steps are not necessarily performed in the order indicated by the arrows. Unless explicitly stated herein, the performing of these steps is not strictly limited to the order, and these steps may be performed in other orders. Moreover, at least a part of the steps in the flowcharts involved in the above embodiments may include multiple steps or multiple stages, and these steps or stages are not necessarily performed and completed at the same time, but may be performed at different times. The performing order of these steps or stages is not necessarily sequential, but may be performed alternately or in turn with other steps or at least a part of the steps or stages of the other steps.

What is claimed is:

1. An image display method, comprising:
obtaining attribute information of each of sub-pixels in an under-display camera region and in a normal display region;
calculating a compensated brightness value of the under-display camera region according to the attribute information;
calculating a retaining ratio according to the number of sub-pixels retained in the under-display camera region;
taking the retaining ratio as an attenuation degree of the normal display region;
calculating the attenuated brightness value; and
displaying an image according to the compensated brightness value and the attenuated brightness value;
wherein the attenuated brightness value is calculated by a following formula:

$$G_{out} = G_{in} * \left(\frac{1}{m}\right)^{\frac{1}{2.2}}$$

wherein $G_{in}$ denotes a current brightness value of each of the sub-pixels of the displayed image; $G_{out}$ denotes the attenuated brightness value of the sub-pixel in the normal display region; 1/m is the retaining ratio.

2. The image display method according to claim 1, wherein the attribute information comprises a brightness value and arrangement information of each of the sub-pixels.

3. The image display method according to claim 1, wherein the calculating the compensated brightness value of the under-display camera region comprises:
obtaining a gray value of each of the sub-pixels within a pixel unit range of a displayed image;
multiplying an average value of the gray values by an area coefficient; and
calculating the compensated brightness value of the under-display camera region based on the multiplying result.

4. The image display method according to claim 3, wherein the average value is calculated by a following formula:

$$G_{out} = \left((G_0^{2.2} + G_1^{2.2} + G_2^{2.2} + G_3^{2.2}) * \frac{1}{4} * W_R\right)^{\frac{1}{2.2}}$$

wherein $G_0$, $G_1$, $G_2$, and $G_3$ denote the brightness values of the sub-pixels within the pixel unit range respectively; $W_R$ denotes the area coefficient of the sub-pixels; $G_{out}$ denotes an average output brightness value of the sub-pixels.

5. The image display method according to claim 4, wherein the area coefficient $W_R$ is a number greater than 1.

6. The image display method according to claim 1, further comprising:
generating a brightness transition region between the under-display camera region and the normal display region.

7. The image display method according to claim 6, wherein the generating the brightness transition region comprises:
generating the brightness transition region with a preset width;
obtaining a distance between each of the sub-pixels in the brightness transition region and the under-display camera region; and
calculating a brightness value of each of the sub-pixels in the brightness transition region according to a current brightness value of the corresponding sub-pixel in the brightness transition region, a brightness value of a corresponding sub-pixel in the under-display camera region, and the distance.

8. The image display method according to claim 7, wherein the brightness value of each of the sub-pixels in the brightness transition region is calculated by a following formula:

$$data_{out} = data_{in} + (v - data_{in}) * d/D$$

wherein $data_{out}$ denotes the brightness value output by each of the sub-pixels in the brightness transition region; $data_{in}$ denotes a current brightness value of the sub-pixel; d denotes the distance between the sub-pixel in the brightness transition region and the under-display camera region; D denotes the preset width of the brightness transition region; v denotes a brightness value of a corresponding sub-pixel in a pixel unit range in the under-display camera region.

9. The image display method according to claim 8, wherein the preset width increases with an increased size of a display panel.

10. The image display method according to claim 8, wherein the preset width increases with an increased size of a camera.

11. An image display method, comprising:
obtaining attribute information of each of sub-pixels in an under-display camera region and in a normal display region;
generating a brightness transition region between the under-display camera region and the normal display region, wherein the generating the brightness transition region comprises:
generating the brightness transition region with a preset width;
obtaining a distance between each of the sub-pixels in the brightness transition region and the under-display camera region;
calculating a brightness value of each of the sub-pixels in the brightness transition region according to a current brightness value of the corresponding sub-pixel in the brightness transition region, a brightness value of a corresponding sub-pixel in the under-display camera region, and the distance; wherein
the brightness value of each of the sub-pixels in the brightness transition region is calculated by a following formula: $data_{out} = data_{in} + (v - data_{in}) * d/D$ wherein $data_{out}$ denotes the brightness value output by each of the sub-pixels in the brightness transition region; $data_{in}$ denotes a current brightness value of the sub-pixel; d denotes the distance between the sub-pixel in the brightness transition region and the under-display camera region; D denotes the preset width of the brightness transition region; v denotes a brightness value of a corresponding sub-pixel in a pixel unit range in the under-display camera region;

calculating a compensated brightness value of the under-display camera region and an attenuated brightness value of the normal display region according to the attribute information; and displaying an image according to the compensated brightness value and the attenuated brightness value.

12. An image display method, comprising:

obtaining attribute information of each of sub-pixels in an under-display camera region and in a normal display region;

calculating a compensated brightness value of the under-display camera region and an attenuated brightness value of the normal display region according to the attribute information, wherein the calculating the compensated brightness value of the under-display camera region comprises:

obtaining a gray value of each of the sub-pixels within a pixel unit range of a displayed image;

multiplying an average value of the gray values by an area coefficient, wherein the average value is calculated by a following formula:

$G_{out} = (G_0^{2.2} \pm G_1^{2.2} + G_2^{2.2} + G_3^{2.2}) * \frac{1}{4} * W_R$) wherein $G_0$, $G_1$, $G_2$, and $G_3$ denote the brightness values of the sub-pixels within the pixel unit range respectively; $W_R$ denotes the area coefficient of the sub-pixels; $G_{out}$ denotes an average output brightness value of the sub-pixels; wherein the area coefficient $W_R$ is a number greater than 1;

calculating the compensated brightness value of the under-display camera region based on the multiplying result; and displaying an image according to the compensated brightness value and the attenuated brightness value.

* * * * *